United States Patent [19]
Cheung et al.

[11] Patent Number: 5,908,312
[45] Date of Patent: Jun. 1, 1999

[54] SEMICONDUCTOR DEVICE FABRICATION

[75] Inventors: Kin Ping Cheung, Hoboken; Steven James Hillenius, Summit; Chun-Ting Liu, Berkeley Heights, all of N.J.; Yi Ma; Pradip Kumar Roy, both of Orlando, Fla.

[73] Assignee: Lucent Technologies, Inc., Murray Hill, N.J.

[21] Appl. No.: 08/864,220

[22] Filed: May 28, 1997

Related U.S. Application Data

[63] Continuation-in-part of application No. 08/646,197, May 7, 1996, abandoned.

[51] Int. Cl.$^6$ .................................................. H01L 21/336
[52] U.S. Cl. ........................ 438/287; 438/766; 438/770; 438/786
[58] Field of Search .................................. 438/287, 766, 438/770, 786

[56] References Cited

U.S. PATENT DOCUMENTS

| | | |
|---|---|---|
| 5,316,965 | 5/1994 | Philipossian et al. . |
| 5,330,920 | 7/1994 | Soleimani et al. . |
| 5,385,630 | 1/1995 | Philipossian et al. . |
| 5,596,218 | 1/1997 | Soleimani et al. . |

OTHER PUBLICATIONS

D. M. Fleetwood and N. S. Saks, "Oxide, Interface, and Border Traps in Thermal $N_2O$–Nitrided Oxides", J. Appl. Phys., 79, 1583 (1996).

H. Shin and C. Hu, "Monitoring Plasma–Process Induced Damage in Thin Oxide", IEEE Tran. Semicond. Manufacturing, 6, 96 (1993).

K. P. Cheung, "On the use of Fowler–Nordheim stress to reveal plasma–charging damage", Proceedings, 1996 International Symp. On Plasma Process Induced Damage (P2ID), Santa Clara, CA, U.S.A., p. 11.

L. K. Han, M. Bhat, D. Wristers, H. H. Wang, and D. L. Kwong, "Recent Developments in Ultra Thin Oxynitride Gate Dielectrics", Microelectronic Engineering 28, 1995, pp. 89–96.

C.T. Liu, Y. Ma, K. P. Cheung, C. P. Chang, L. Fritzinger, J. Becerro, H. Luftman, H. m. Vaidya, J. I. Colonell, A. Kamgar, J. F. Minor, R. G. Murray, W. Y. C. Lai, C. S. Pai and S. J. Hillenius, "25Å Gate Oxide without Boron Penetration for 0.25 and 0.3–$\mu$m PMOSFETs", Technical Digest, 1996 Symposium on VLSI Technology, Honolulu, U.S.A., p. 18.

(List continued on next page.)

*Primary Examiner*—John F. Niebling
*Assistant Examiner*—Jonathan Hack

[57] ABSTRACT

A method of preventing diffusion penetration of the dopant used to dope polysilicon gate material in a MOSFET is disclosed. Atomic nitrogen is introduced into the substrate prior to gate oxide growth. The nitrogen later diffuses upward into the gate oxide and blocks subsequent ion implanted gate dopants from penetrating to the substrate. Low dosages of atomic nitrogen implantation, while not significantly affecting gate oxide growth rate, produce significant improvements in the damage immunity of thin gate oxides.

12 Claims, 5 Drawing Sheets

OTHER PUBLICATIONS

Kin P. Cheung, "A new method to monitor gate–oxide reliability degradation," Tech. Digest, VLSI Technology Symposium, 1995, pp. 83.

T. Arakawa, T. Hayashi, M. Ohno, R. Matsumoto, A. Uchiyama and H. Fukuda, "Relationship between Nitrogen Profile and Reliability of Heavily Oxynitrided Tunnel Oxide Films for Flash Electrically Erasable and Programmable ROMs", Jpn. J. Appl. Phys., 34, 1007 (1995).

J. Yoon, S. Lee and B. Kim, "The Evaluation of Plasma Damage on $N_2O$ Oxide and Pure Oxide", Proceedings, 1996 International Symp. On Plasma Process Induced Damage (P2lD), Santa Clara, CA, U.S.A., p. 181.

Liu et al., "Light Nitrogen Implant for Preparing THin–Gate Oxides," IEEE Electron Device Letters, vol. 18, No. 3, pp. 105–107, Mar. 1997.

Doyle et al., "Simultaneous Growth of Different Thickness Gate Oxides in Silicon CMOS Processing," IEEE Electron Device Letters, vol. 16, No. 7, pp. 301–302, Jul. 1995.

Liu et al., "25 Angstrom Gate Oxide without Boron Penetration for 0.25 and 0.3–micron PMOSFET," 1996 Symosium on VLSI Technology Digest of Technical Papers, IEEE, pp. 18, 19, Jun. 11, 1996.

Soleimani et al., "Formation of Ultrathin Nitrided SiO2 Oxides by Direct Nitrogen Implantation into Silicon," J. Electrochem. Soc., vol. 142, No. 8, pp. L132–L135, Aug. 1995.

Liu et al., "High Performance 0.2 micron CMOS with 25 Angstrom Gate Oxide Growth on Nitrogen Implanted Si Substrates," IEEE, IEDM 96–499–502, 1996.

SEMICONDUCTOR DEVICE FABRICATION

This application is a Continuation-In-Part of U.S. patent application Ser. No. 08/646,197, filed May 7, 1996, now abandoned.

BACKGROUND OF THE INVENTION
1. Field of Invention

This invention relates to methods of semiconductor fabrication and devices formed thereby.

2. Description of Related Art

As integrated circuit technology advances, the gate widths of MOSFETS become increasingly smaller. In addition, the thicknesses of the gate dielectrics, typically, gate oxides, become thinner and thinner. Very thin gate oxides are necessary for small CMOS transistors.

Often, ion implantation with boron $BF_2$ is used to dope the polysilicon gates of surface channel PMOSFETS. However, as gate oxides become increasingly thinner, boron penetration through the gate oxide by diffusion in subsequent thermal cycles becomes a problem. Typically, the boron penetrates the gate oxide, doping the channel and adversely affecting the device threshold voltage, short channel effects, and circuit performance.

A variety of process steps have been tried to reduce boron penetration through the gate oxide. Some of these approaches have utilized nitrogen in an effort to reduce boron penetration through the gate oxide.

For example, after blanket layers of gate oxide and polysilicon have been deposited (but before the gate has been defined) nitrogen has been implanted into the polysilicon layer. It is hoped the nitrogen blocks the subsequently implanted boron. This approach is detailed in: T. Kuroi et al. 1994 Symp. on VLSI Tech., p. 107.

Another approach involves growing the gate oxide in an ambient of $N_2O$. This approach is detailed in Lo et al., IEEE Electron Device Letters, Volume 13, p. 111, February 1992.

A third approach involves growing a conventional gate oxide by conventional processes and then annealing the gate oxide in a nitrogen ambient. This approach is detailed in: K. Kirsch et al., IEEE IEDM, p. 325, 1994.

Nevertheless, those concerned with the development of integrated circuits processes still continually search for improved methods of reducing boron penetration.

As device dimensions scale down rapidly with the advance of VLSI technologies, the electric field in the thin gate oxides continues to increase. Part of the consequence of such increased electric field is the increased trap generation at the oxide interface or within the thin oxides. The trap generation and the capture of channel electrons by the traps in turn leads to increased low frequency (l/f) noise and transconductance ($g_m$) degradation. For ultra-thin oxides of less than 50 Å, the tunneling current also becomes significant and gives rise to accelerated degradation of the device characteristics.

SUMMARY OF THE INVENTION

These concerns are addressed by the present invention which includes in an illustrative embodiment:
embedding atomic nitrogen into a substrate;
forming a dielectric layer upon the substrate;
forming a material layer upon the dielectric layer;
exposing the material to a dopant species; and
patterning the material layer to form a gate.

DETAILED DESCRIPTION OF PREFERRED EMBODIMENTS

Figure 1:
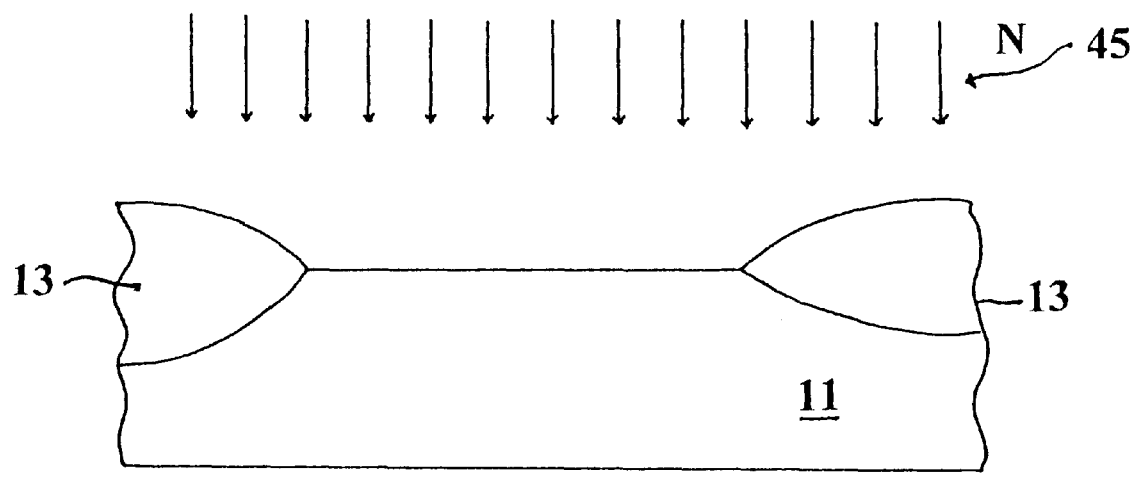
FIGS. 1, 2 and 3 are cross-sectional views useful in understanding an illustrative embodiment of the present invention.

In FIG. 1, reference numeral 11 denotes a substrate which may be silicon, doped silicon, epitaxial silicon, etc. The term "substrate" refers to a material or layer upon which other layers may be formed.

Reference numeral 13 denotes a field oxide which may be formed by well known LOCOS or poly-buffered LOCOS processes.

Typically, a layer of sacrificial silicon dioxide (not shown) having a thickness of approximately 200 Å may be formed upon the upper surface of substrate 11.

After the formation of field oxide 13, an ion implantation, utilizing atomic nitrogen (which has an atomic weight of 14) denoted by reference numeral 45 is performed. Illustratively, the implantation may be performed at an energy between 5 KeV and 50 KeV. A typical dosage is $1 \times 10^{14}/cm^2$. Illustratively, the dosage may be between $1 \times 10^{14}/cm^2$ and $5 \times 10^{14}/cm^2$. The nitrogen species embed themselves within silicon substrate 11. Atomic nitrogen, N, is the implant species. Molecular nitrogen, $N_2$, is not used for reasons mentioned below.

Plasma damage immunity of gate oxide grown on very low dose ($2 \times 10^{13}/cm^2$)$N^+$ implanted silicon is found to be improved. At higher dosages of $N^+$ implant ($N^+$ I/I), improvement of the damage immunity was also observed as improvement of $g_m$ degradation. Both hole trapping and electron trapping during current stress are suppressed. Hole trapping behavior was determined from the relationship between initial electron trapping slope (IETS) and threshold voltage shifts due to current stress. This method is believed to be far more reliable than the typical method of gate voltage lowering during current stress.

Very thin gate oxides are required for device scaling into the deep submicron regime. The reliability of these very thin gate oxides is naturally a very important concern. One of the stress modes that do not scale with the oxide thickness is plasma-charging damage. Improving the gate oxide's immunity to plasma-charging damage is therefore a high priority issue.

We introduced a light dose of nitrogen implant ($N^+$ I/I) into the Si substrate before growing the oxides, and incorporated ~3-4 atomic % of nitrogen in the oxides. Consequently, the l/f noise is reduced by a factor of 2–5, and the $g_m$ degradation is reduced by a factor of 5. The $N^+$ I/I does not affect the oxide breakdown field which continues to follow the hole-trap model as the oxide thickness reaches 25 Å in this experiment. MOSFETs of 0.2 µm physically are then fabricated with 25 Å oxides on $N^+$ I/I substrates.

In order to see how sensitive the improvement in damage immunity is on $N^+$ implant, at first a very light dose of $2 \times 10^{13}/cm^2$ $N^+$ I/I is used. At this dose level, the gate oxide growth rate was not affected (within the 3% measurement uncertainty) by the nitrogen, thus allowing for a very close comparison study.

Wafers were processed to metal 1 level using a 0.25 µm CMOS technology. The $N^+$ split was accomplished by introducing an additional blanket implant step. Otherwise, the control (thermal oxide) and split (N$^+$ oxide) are exactly the same and processed together throughout. Gate oxide thickness was 52 Å for both types as measured by multi-angle ellipsometry and TEM. N$^+$ was implanted through a 200-Å sacrificial oxide using 25 keV energy. The sacrificial oxide was removed before gate oxide was grown (dry O$_2$ at 800° C., 25 minutes). Wafers were annealed in forming gas (400° C., 30 minutes) before measurement.

Transistors with antenna ratio of 2571:1 were used in this study. Threshold voltage (V$_t$) and transconductance (G$_m$) before stress were very uniform across the wafer. Each transistor was subjected to a 400 mA/cm$^2$ constant current stress for 4.5 seconds using gate injection mode. Initial electron trapping slopes (IETS) (the steepest slope after the turnaround point) were extracted from the voltage versus time (V-T) curve during stress. Post stress transistor measurements were done at fixed delay of about 10 seconds in an automated setup. V$_t$ and G$_m$ shifts ($\Delta$V$_t$ and $\Delta$G$_m$) due to stress were obtained from subtracting the before stress values from the after stress values.

Figure 4:
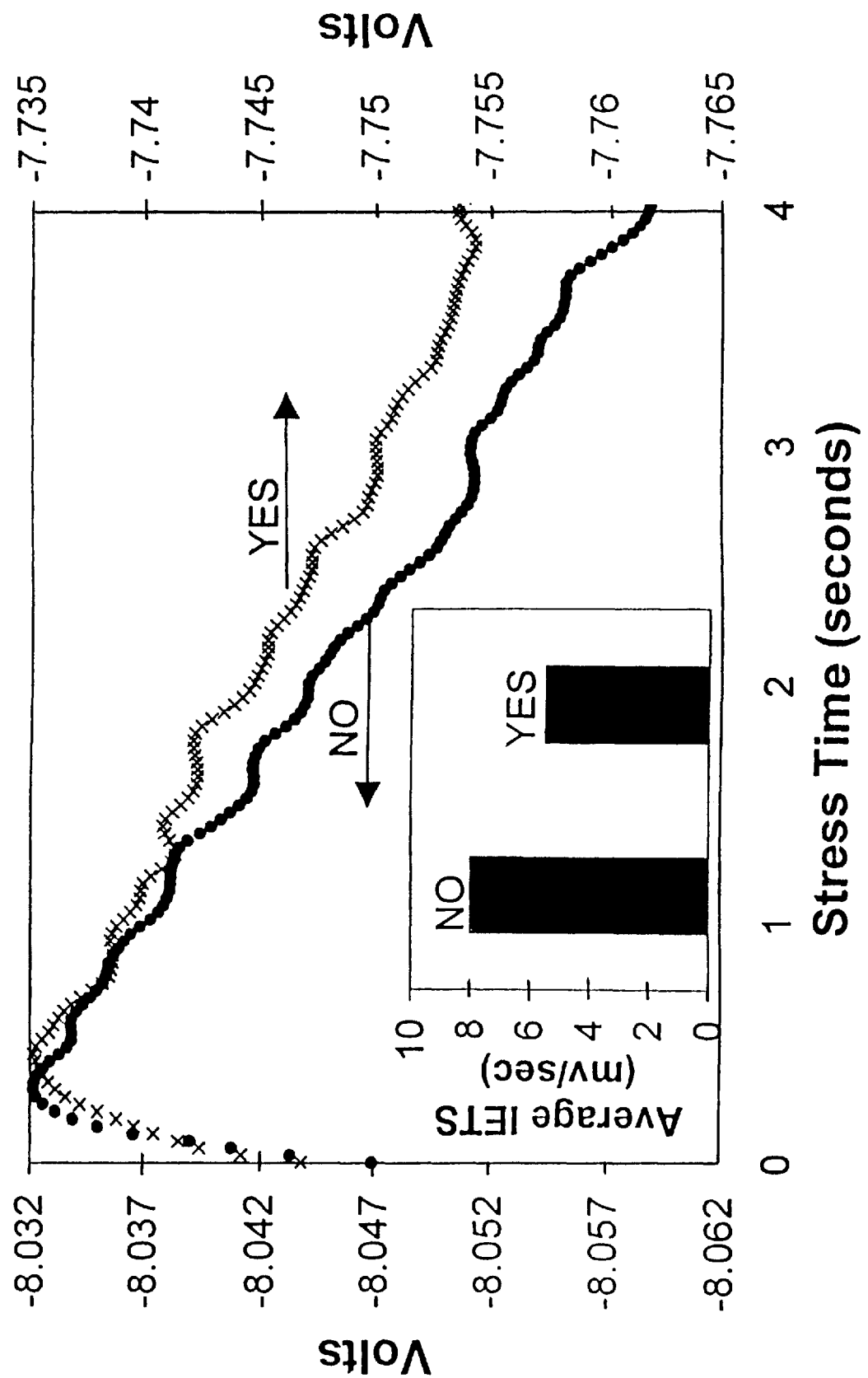
FIGS. 4, 5 and 6 illustrate the improvement in gate oxide reliability resulting from implanting atomic nitrogen into a semiconductor substrate.

FIG. 4 shows the typical V-T curves for the two types of oxide. Both curves show hole trapping at first (gate voltage (V$_g$) become less negative) and then electron trapping takes over. The noise in the curves is due to the instrument (HP4145A). The electron trapping is clearly lower in the N$^+$ oxide (smaller IETS). The small difference in V$_g$ is an indication of the N$^+$ oxide being thinner by about 3% (V$_g$ is very sensitive to oxide thickness, more sensitive than TEM or ellipsometry). The average IETS of 42 devices each of the two splits is shown in the insert. These wafers were processed in a known plasma-charging damage tool during fabrication. Some degree of damage is therefore expected in both types of oxides (we estimate that a damage free oxide should have an IETS of around 4 mV/sec for the stress condition and oxide thickness). As shown in FIG. 4, the increase in electron trap density due to charging damage is lower for the N$^+$ oxide.

Figure 5:
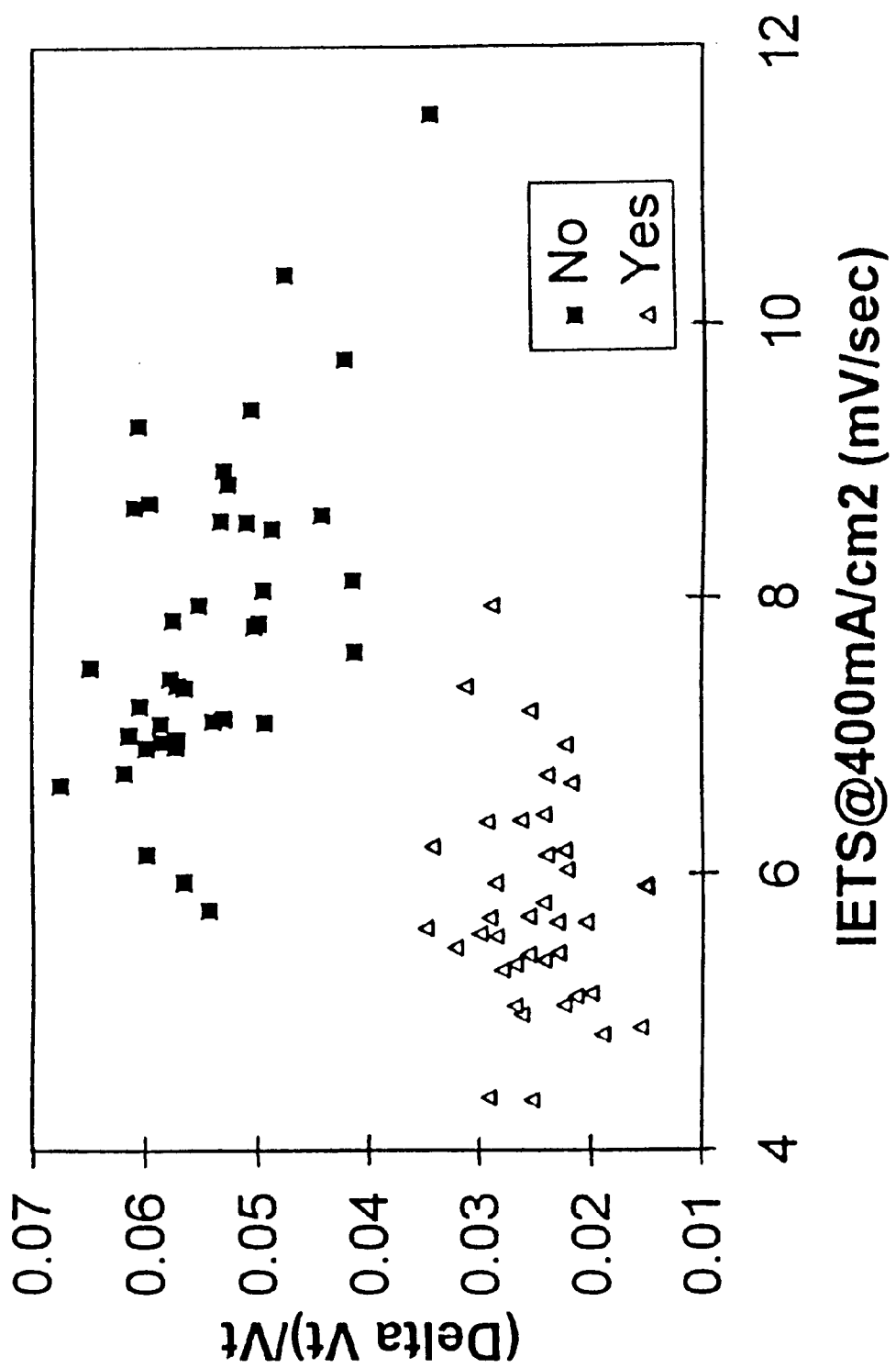

FIG. 5 plots the $\Delta$V$_t$/V$_t$ versus IETS. For the devices with normal oxide, $\Delta$V$_t$/V$_t$ is linearly related to IETS with a negative slope as expected. For a given oxide, hole trapping depends only on the level of current stress while electron trapping increases with damage. The net amount of positive charge (hence $\Delta$V$_t$/V$_t$) in the oxide therefore decreases with damage. If the N$^+$ oxide's hole trapping behavior is similar to normal oxide, they should follow the same trend. As can be seen from FIG. 5, devices with N$^+$ oxide not only have a low IETS, but also have a much lower than expected $\Delta$V$_t$/V$_t$. The low $\Delta$V$_t$/V$_t$ indicates a low density of trapped holes in the oxide. Since IETS is low also, the low $\Delta$V$_t$/V$_t$ must be due to less hole trapping during stress.

Figure 6:
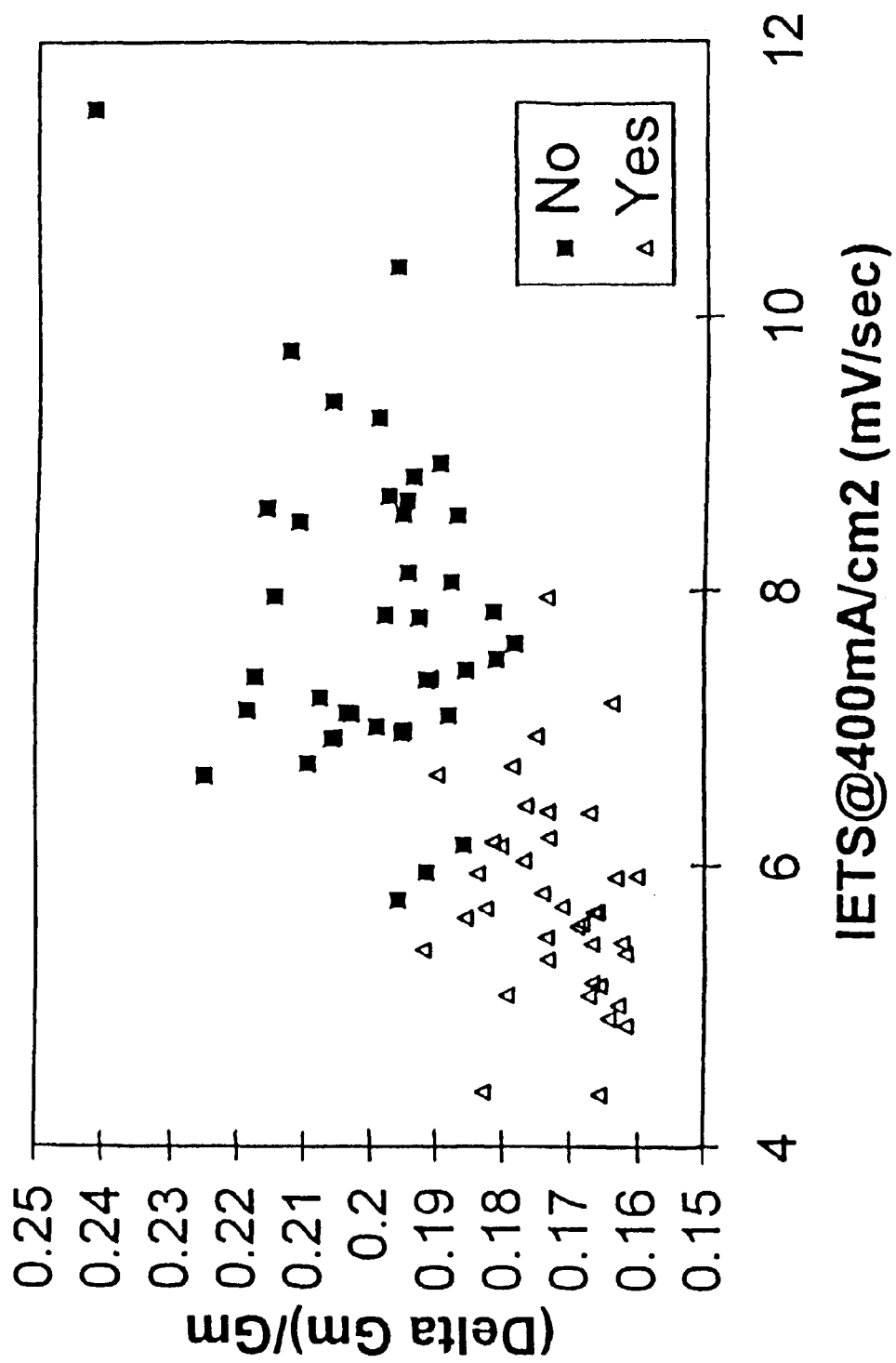

FIG. 6 plots the $\Delta$G$_m$/G$_m$ (g$_m$) versus IETS. Unlike $\Delta$V$_t$/V$_t$, the g$_m$ behavior for both types of oxide follows the same trend as reported previously, increases with IETS. The g$_m$ for N$^+$ oxide is, as expected, lower than normal oxide after the same stress. IETS has been found to be completely insensitive to the trap states at the SiO$_2$/Si interface. Yet, IETS is linearly proportional to the g$_m$, a quantity that is most sensitive to interface state density. We can either conclude that the bulk electron trap density is linearly proportional to interface state density or conclude that the variation in g$_m$ is due to near interface electron traps. The forming gas anneal completely passivated all the interface states before stressing. Any interface state signal that is proportional to the degree of damage suggests that damage generated interface states are different from the normal type of interface states. Indeed, such damage related interface states had been observed before. Our result suggests that these damage related interface states are linearly proportional to the damage generated bulk electron traps. From a detrapping kinetic study that we performed, however, we tend to believe that the g$_m$ change is due to near interface electron traps. The N$^+$ oxide suppressed electron trap generation and therefore suppressed g$_m$ or transconductance degradation during stress.

In conclusion, we found that even a very low dose (such as 2×10$^{13}$/cm$^2$) of N$^+$ implant before gate oxide growth can improve the gate oxide's resistance to plasma-charging damage. We found that both electron trapping and hole trapping are suppressed effectively during current stress.

In the embodiment of the present invention wherein the N$^+$ implantation is at higher dosages, such as at approximately 1×10$^{14}$/cm$^2$, or higher, after the nitrogen implantation, the sacrificial oxide is removed, typically in an HF solution which also serves as a pre-gate clean upon the upper surface of silicon substrate 11.

Figure 2:
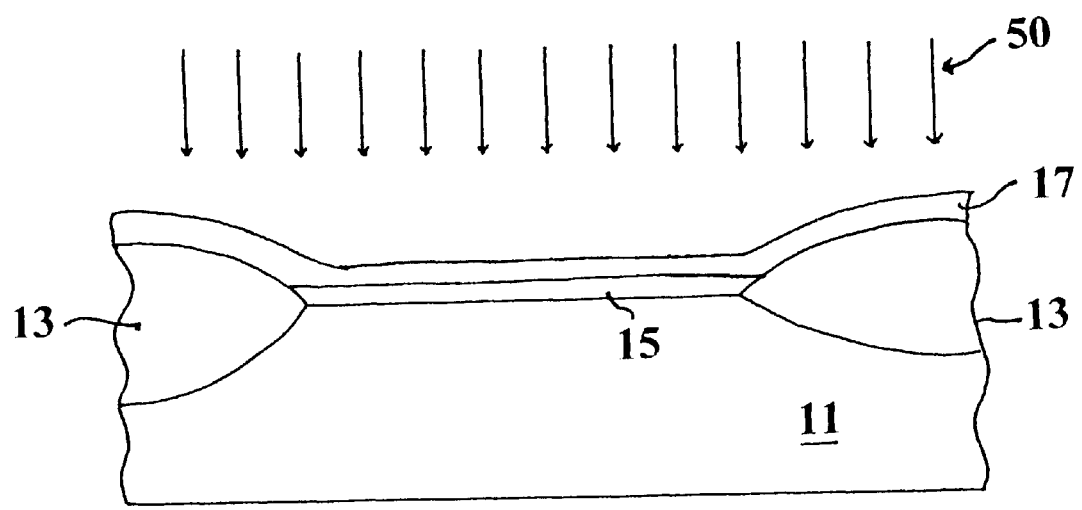

Turning to FIG. 2, a gate oxide 15 having a typical thickness of 10 Å~200 Å±5% is grown. Next, a blanket polysilicon layer 17 having a thickness of approximately 1000 Å is deposited. Applicant's investigations have incidentally shown that the nitrogen implantation of FIG. 1 causes a reduction in the growth rate of the gate oxide 15 depicted in FIG. 2. Typically, oxide 15 may be formed at 800° C. in an atmosphere of O$_2$ for 20 minutes. A reduction of growth rate by more than 20% has been typically observed. For example, without a prior nitrogen implantation, 34 Å will grow in 10 minutes. However, with a prior nitrogen implantation, of 2E14, 25 Å of silicon dioxide grows in 10 minutes. Without a nitrogen implantation, 52 Å of oxide grows in 25 minutes. With a nitrogen implantation, 40 Å of oxide grows in 25 minutes. The slower growth rate produces a higher quality thin oxide.

Next, polysilicon layer 17 is doped with boron 50, illustratively at a dose between 3~5E15/cm$^2$ and energy between 5~20 KeV. The implanted boron is subsequently diffused to uniformly dope the entire polysilicon layer. The diffusion of boron is achieved with several thermal cycles. Typically, a single thermal cycle comprises exposure of the wafer to a temperature of 800° C.–1100° C. for a time of approximately 10 sec–30 min. However, without the previously implanted nitrogen, boron diffusion does not stop completely at the interface between polysilicon 17 and gate oxide 15, and some boron penetrates through the gate oxide 15. Such boron penetration causes various problems with production, process control, device reliability, and circuit performance.

Figure 3:
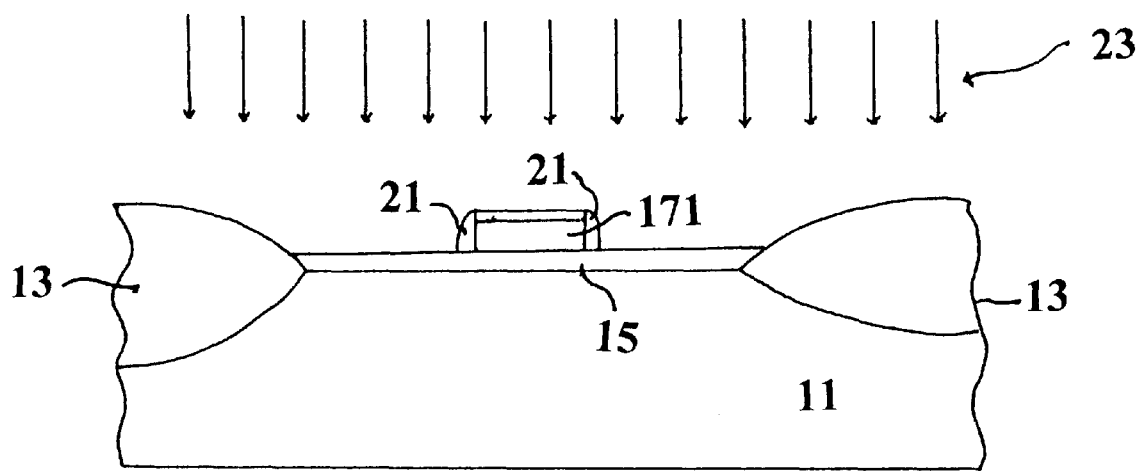

Turning to FIG. 3, layer 17 is patterned to define a gate 171. Spacers 21 are subsequently formed. Next, an ion implantation 23, typically utilizing BF$_2$ is performed to define at least a portion of the source and drain. Further processing including dielectric deposition, window opening and metallization may be then performed. Applicant's investigations have shown, however, that the boron 50 which is implanted to dope the gate as shown in FIG. 2, does not penetrate gate oxide 15 when the gate oxide is grown upon a substrate 11 which has been implanted with atomic nitrogen 45 in the dosages described above. It is hypothesized, that during the thermal treatment which causes the growth of gate oxide, that the nitrogen diffuses from substrate 11 into the oxide where it remains. Applicant's secondary ion masked spectroscopy (SIMS) analysis of gates formed by the above-described method show a clear nitrogen peak within the oxide. Furthermore, the boron concentration in the oxide falls off immediately before the nitrogen peak, thereby indicating that the boron ions are effectively blocked by the nitrogen.

Applicant's investigations have shown that the threshold voltage of transistors formed by the above-described procedure increases compared to threshold voltages of transistors formed by the method in the publication by T. Kuroi et al., 1994 Symp. on VLSI Tech., p. 107.

Applicant's studies have shown that the variation in gate oxide 15 thickness drops from about 1% to 0.4%. Other beneficial observed effects are a steeper sub-threshold slope and reduction of short channel effects.

The nitrogen 45 may be introduced into substrate 11 by any other convenient means, e.g., diffusion.

An alternative embodiment includes the growth of gate oxide 15 in an $N_2O$ atmosphere at a temperature between 800–900° C., preferably 850° C., for a time between 5 and 30 minutes (after the atomic nitrogen implantation described above). The use of an atomic nitrogen implantation into the silicon substrate together with gate oxide growth in $N_2O$ provides additional assurance that the subsequent boron implant species will not diffuse into the channel.

While a purpose of atomic nitrogen implantation plus an oxygen oxidation is to block boron diffusion from polysilicon to a silicon substrate, an oxidation in $N_2O$ following implantation is expected to improve the $SiO_2/Si$ interface reliability, the nitrogen existence during oxidation forms Si—N bonds at the $SiO_2/Si$ interface and reduces the Si—H bond concentration. This kind of interface will strongly resist degradation under device operation or hot electron stress. As discussed above, nitrogen implantation at dosages too low to have a significant effect on the growth of gate oxide, do result in improvements to the damage immunity of thin gate oxides.

The inventive processes and devices described herein are to be distinguished from the method disclosed in Solelmani et al., Journal of Electrical Chemical Society, Vol. 142, No. 8, August 1995, pp. L132–134. The Solelmani article describes the use of implanted $N_2$ (as contrasted with atomic nitrogen taught by Applicant) at doses above $1E15/cm^2$ for the purpose of forming nitrided silicon dioxide layers. However, Applicant's investigations have shown that doses between $10^{13}/cm^2$ and $5\times10^{14}/cm^2$ are much preferable for Applicant's purpose of blocking unwanted diffusion of gate dopants.

The higher dosages necessary to achieve results in Solelmani et al. produce undesired dislocations in the silicon substrate. These dislocations cannot be completely annealed out in subsequent thermal treatments. Such dislocations contribute to transistor leakage. Furthermore, as mentioned previously, Solelmani utilizes $N_2$, molecular nitrogen, while Applicant teaches the use of atomic nitrogen. Use of atomic nitrogen is preferable because the likelihood of introducing unwanted contaminants through the ion implantation process is reduced. (Ion implantation apparatus selects the implantation species on the basis of e/m, where e is the electronic charge and m is the mass (i.e, atomic weight) of the species. If $N_2$, having an atomic weight of 28 is chosen, then both singly ionized silicon, having an atomic weight of 18 or doubly ionized iron, having an atomic weight 56, will also be implanted together with the $N_2$. If atomic nitrogen, with an atomic weight of 14 is chosen, then doubly ionized silicon will also be inadvertently implanted. However, the unwanted implant species which accompany atomic nitrogen occur more rarely than the unwanted species which accompany $N_2$, according to the natural concentration of atomic isotopes. Consequently, Applicant's choice of atomic nitrogen is superior for the solution of the problems addressed by Applicant.

What is claimed is:

1. A method of semiconductor integrated circuit fabrication comprising:

embedding atomic nitrogen into a substrate such that said atomic nitrogen extends to a top surface of said substrate;

forming a dielectric layer upon said substrate after said embedding step;

forming a material layer upon said dielectric layer;

exposing said material layer to a dopant species;

patterning said material layer to form a gate.

2. The method of claim 1 in which said embedding step includes ion implantation.

3. The method of claim 2 in which said embedding step includes ion implantation which is performed at an energy between 5 KeV and 50 KeV and at a dose between $10^{13}/cm^2$ and $5\times10^{14}/cm^2$.

4. The method of claim 1 in which said material layer is polysilicon.

5. The method of claim 1 in which said dopant species is boron.

6. The method of claim 1 in which said dielectric is thermally grown silicon dioxide.

7. The method of claim 6 in which said dielectric is formed by exposing said substrate to oxygen at a temperature between 700° C. and 1000° C.

8. The method of claim 1 in which the thickness of said dielectric is between 10 Å and 200 Å.

9. The method of claim 1 in which the thickness of said material layer is between 500Å and 3000Å.

10. The method of claim 1 in which said dielectric is formed by exposing said substrate to an atmosphere of $N_2O$.

11. The method of claim 10 in which said exposure occurs at a temperature between 800 and 900° C.

12. The method of claim 3 in which the dose is about $1\times10^{14}/cm^2$ to about $5\times10^{14}/cm^2$.

* * * * *